United States Patent
Aiello et al.

[19]

[11] Patent Number: 6,091,276
[45] Date of Patent: Jul. 18, 2000

[54] DEVICE IN AN EMITTER-SWITCHING CONFIGURATION WITH MEANS FOR RECOVERING THE ELECTRICAL CHARGE DURING TURNING OFF

[75] Inventors: Natale Aiello, Catania; Atanasio La Barbera, Palermo, both of Italy

[73] Assignee: STMicroelectronics S.r.l., Agrate Brianza, Italy

[21] Appl. No.: 09/067,365

[22] Filed: Apr. 27, 1998

[30] Foreign Application Priority Data

May 13, 1997 [IT] Italy .............................. MI97A001116

[51] Int. Cl.[7] .................................................. H03K 17/04
[52] U.S. Cl. .......................... 327/376; 327/377; 327/433; 327/434
[58] Field of Search ..................... 327/374–377, 327/380–383, 389, 391, 427, 483, 491, 430, 431, 432, 433, 434, 436

[56] References Cited

U.S. PATENT DOCUMENTS

| | | | |
|---|---|---|---|
| 4,356,416 | 10/1982 | Weischedel | 327/375 |
| 4,360,744 | 11/1982 | Taylor | 327/374 |
| 4,500,802 | 2/1985 | Janutka | 327/432 |
| 4,697,155 | 9/1987 | Lehning | 330/297 |
| 5,126,652 | 6/1992 | Carlin | 323/267 |
| 5,576,570 | 11/1996 | Ohsawa et al. | 257/369 |
| 5,644,266 | 7/1997 | Chen et al. | 327/534 |
| 5,745,008 | 4/1998 | Luong et al. | 330/255 |
| 5,896,043 | 4/1999 | Kumagai | 326/68 |

*Primary Examiner*—Tuan T. Lam
*Attorney, Agent, or Firm*—Theodore E. Galanthay; Allen, Dyer, Doppelt, Milbrath & Gilchrist, P.A.

[57] ABSTRACT

A device in an emitter-switching configuration comprises a high-voltage transistor having a first terminal connected directly to a first power terminal of the device, a control terminal connected to a control terminal of the device, and a second terminal. The device also includes a low-voltage transistor having a first terminal connected directly to the second terminal of the high-voltage transistor and a second terminal and a control terminal which are connected directly to a second power terminal and to the control terminal of the device, respectively. A circuit portion is provided for recovering an electrical charge discharged from the control terminal of the high-voltage transistor to the second terminal of the low-voltage transistor during the turning-off of the device.

16 Claims, 4 Drawing Sheets

DEVICE IN AN EMITTER-SWITCHING CONFIGURATION WITH MEANS FOR RECOVERING THE ELECTRICAL CHARGE DURING TURNING OFF

FIELD OF THE INVENTION

The present invention relates to semiconductor devices, and, more particularly, to such devices in an emitter-switching configuration.

BACKGROUND OF THE INVENTION

A particular type of device in an emitter-switching configuration is provided by a high-voltage power switching element (for example, a bipolar transistor) and by a low-voltage signal switching element (for example, a bipolar or field-effect transistor). The emitter terminal of the high-voltage transistor is connected to the charge-collection terminal (the collector or drain) of the low-voltage transistor. Typically, the high-voltage transistor has an open-emitter collector-base breakdown voltage ($Bv_{cbo}$) which may reach 2 kV, whereas the low-voltage transistor has a breakdown voltage below 60V. The rapid turn-off of the low-voltage transistor permits an extremely rapid turn-off of the high-voltage transistor and this configuration is, therefore, commonly used in applications in which the high-voltage transistor has to be able to switch rapidly between its conducting and cut-off states.

A device in an emitter-switching configuration includes a turn-off element provided, for example, by a diode connected between the base terminal of the high-voltage transistor and the charge-emitting terminal (the emitter or source) of the low-voltage transistor. During the opening of the device, the turn-off time of the high-voltage transistor is longer than the turn-off time of the low-voltage transistor because of the large accumulation of charge in the base region. After the low-voltage transistor has been turned off cancelling out the emitter current of the high-voltage transistor, the collector current of the high-voltage transistor therefore flows through its base and is discharged by the turn-off element, typically towards a reference terminal to ground. Once the high-voltage transistor has eliminated all of the residual charges in the base, this transistor is turned off and its collector current is brought to zero.

SUMMARY OF THE INVENTION

The inventors have recognized that, in known devices in an emitter-switching configuration, the electrical charge discharged to ground during turning-off is not utilized in any way, resulting in a waste of energy in a circuit in which the device is connected. Accordingly, the object of the present invention is to overcome this drawback. To achieve this object, a device in an emitter-switching configuration includes recovery means for recovering the electrical charge which is commonly discharged to ground during the turning-off stage. The charge can be stored on a capacitor, for example, and used for other purposes, thus achieving a considerable energy saving.

BRIEF DESCRIPTION OF THE DRAWINGS

Further characteristics and advantages of the device in an emitter-switching configuration according to the present invention will become clear from the following description of a preferred embodiment thereof, given by way of non-limiting example with reference to the appended drawings, in which.

DETAILED DESCRIPTION OF THE PREFERRED EMBODIMENTS

Figure 1A:
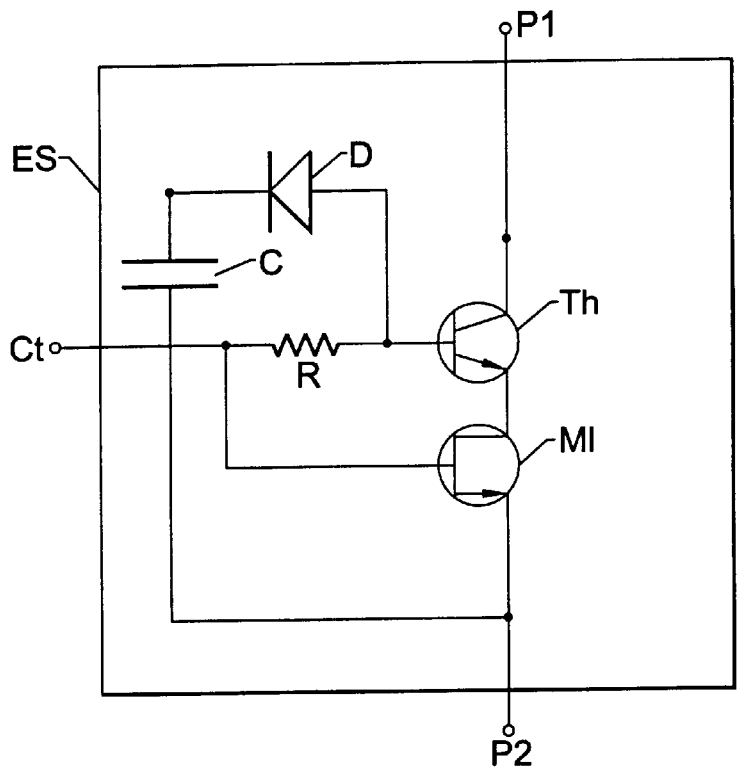
FIGS. 1a–1c show various embodiments of the device in emitter-switching configuration of the present invention.

With reference in particular to FIG. 1a, there is shown a device ES in an emitter-switching configuration comprising a high-voltage bipolar junction transistor (or BJT) Th (of the npn type). The emitter terminal is connected to the drain terminal of a low-voltage (N-channel) metal-oxide-silicon field-effect transistor (MOSFET or simply MOS) M1. The base terminal of the transistor Th, to which an input resistor R is connected, and the gate terminal of the transistor M1, provide a control terminal Ct of the device ES. This permits alternate opening and closing of the connection between the two branches of a circuit connected to a first power terminal (P1) and a second power terminal (P2) of the device ES—these terminals being provided by the collector terminal of the transistor Th and by the source terminal of the transistor M1, respectively.

The device ES also comprises a connection (or turn-off) element provided by a diode D (or a chain of diodes, a Zener diode, or the like) connected between the base terminal of the transistor Th and the source terminal of the transistor M1. In the device of the present invention, the turn-off element also includes means which can recover the electrical charge discharged during the turning-off of the device ES. Preferably, a capacitor C is used and has one terminal connected to the source terminal of the transistor M1 and the other terminal connected to the cathode terminal of the diode D. The anode terminal is connected to the base terminal of the transistor Th. Each time the device ES is turned off, the residual charges in the base of the transistor Th are discharged through the diode D and stored in the capacitor C. The energy thus recovered can therefore subsequently be used for various purposes. The present invention may, however, also be implemented by a MOS transistor having its gate terminal short-circuited to the source terminal, by other equivalent charge-storage means, or by means which can use this electrical charge directly.

Figure 1B:
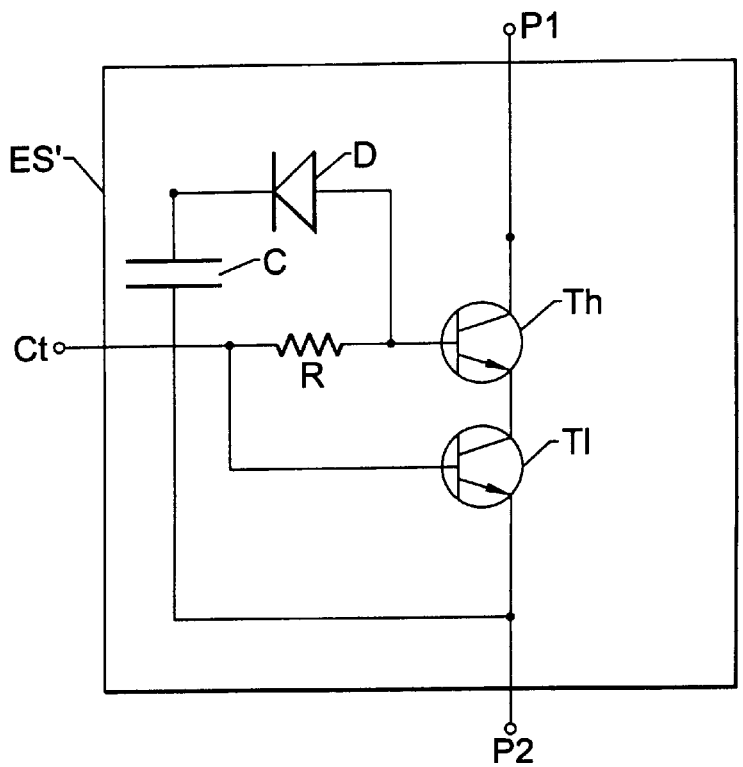

With reference to FIG. 1b (the elements already shown in FIG. 1a are identified by the same reference symbols), similar remarks apply to the device ES' in an emitter-switching configuration. In this embodiment the MOS transistor is replaced by a low-voltage (npn) bipolar transistor T1 or by other equivalent low-voltage switching elements.

Figure 1C:
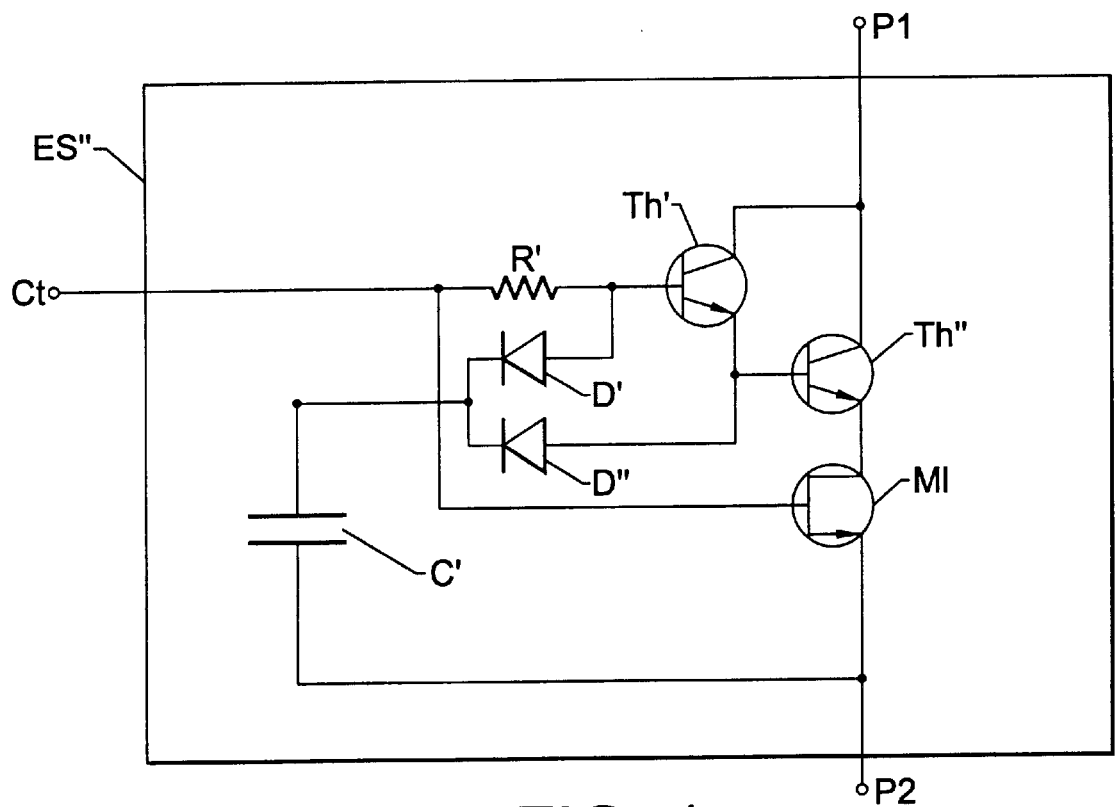

In an alternative embodiment, as shown in FIG. 1c, a device ES" in an emitter-switching configuration is formed with the use of two high-voltage transistors Th' and Th" connected in a Darlington configuration, that is, with their collector terminals in common and with the emitter terminal of the transistor Th' connected directly to the base terminal of the transistor Th". As in the previous embodiment, an input resistor R' is connected to the base terminal of the transistor Th'. The turn-off element is provided by a capacitor C' having one terminal connected to the source terminal of the transistor M1 and the other terminal connected to the cathode terminal of two diodes D' and D". The anode terminals are connected to the base terminals of the transistors Th' and Th", respectively. Similar remarks apply if three or more high-voltage transistors are used in a Darlington configuration or with the use of other equivalent high-voltage switching elements.

Figure 2:
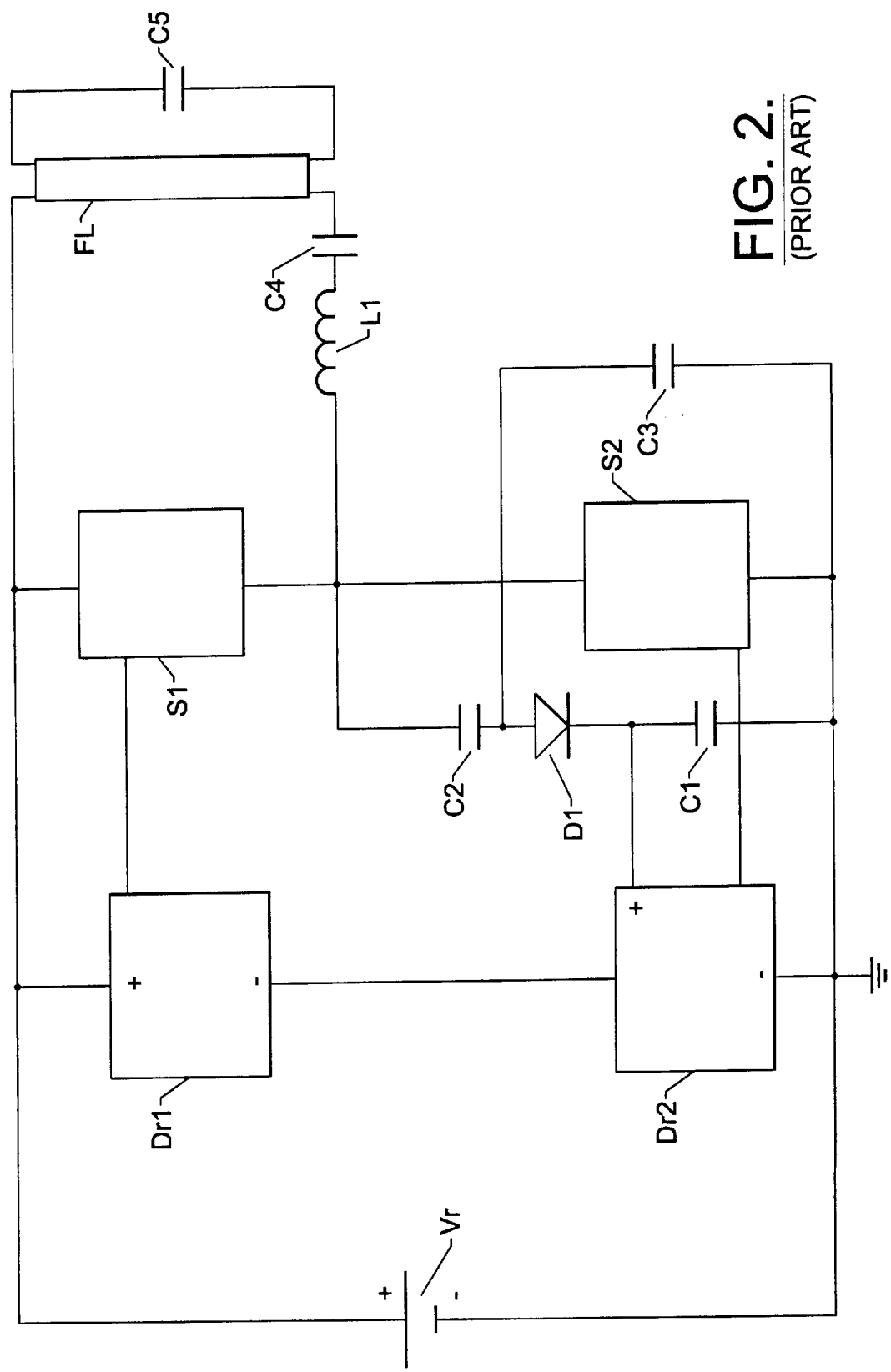
FIG. 2 is a basic diagram of a known circuit for driving a lamp.

A particularly advantageous example of the use of the device in an emitter-switching configuration of the present invention is provided by a circuit in which there is already a capacitor which stores an electrical charge and then supplies it to a suitable user device. With reference in particular to FIG. 2, there is shown a known circuit, including a half-bridge frequency converter for driving a lamp, such as, for example, a fluorescent lamp. The circuit includes a voltage generator Vr which maintains a constant voltage, for example of 300V, between its negative terminal (−), which is connected to a reference terminal, or ground, and its positive terminal (+) The voltage generator Vr is typically provided by a supply which receives an alternating input voltage supplied by a supply mains (for example, with an amplitude of 220V and frequency of 50 Hz), rectifies it and filters it to output a direct-current voltage of the desired value.

Two high-voltage switches S1 and S2 connected in series with one another are connected in parallel with the voltage generator Vr. The switches S1 and S2 have one power terminal in common, whereas the other power terminal of the switch S1 and the other power terminal of the switch S2 are connected, respectively, to the positive terminal (+) and to the negative terminal (−) of the voltage generator Vr. Each of the switches S1 and S2 is controlled by a corresponding driver, Dr1 or Dr2. A control terminal of each of the drivers Dr1 and Dr2 is connected to a corresponding control terminal of the respective switch S1 or S2.

The driver Dr2 is supplied by means of a charge pump connected in parallel with the switch S2 and provided by a capacitor C1, a diode D1 and a further capacitor C2, connected in series with one another. In particular, a first terminal of the capacitor C1 is connected to the power terminal of the switch S2 which, in turn, is connected to the ground terminal. The other terminal of the capacitor C1 is connected to the cathode terminal of the diode D1. The anode terminal of the diode D1 is connected to a terminal of the capacitor C2, the other terminal of which is connected to the other power terminal of the switch S2. A protection capacitor (a snubber) C3 is also connected between the anode terminal of the diode D1 and the power terminal of the switch S2 which is connected to the ground terminal. The capacitance of the capacitor C3 is less than that of the capacitor C1.

The driver Dr2 has a negative supply terminal (−) and a positive supply terminal (+) which are connected, respectively, to the terminal of the capacitor C1 which is connected to the ground terminal, and to the other terminal of the same capacitor C1. A further charge pump, not shown in the drawing, suitably translates the supply voltage of the driver Dr2. This translated voltage is applied to a translation terminal of the driver Dr2 connected to a negative supply terminal (−) of the driver Dr1, a positive supply terminal (+) of which is connected to the positive terminal (+) of the voltage generator Vr. Alternatively, the driver Dr1 is supplied with the use of a charge pump similar to that described above and connected in parallel with the switch S1.

An inductor L1, a capacitor C4 and a lamp FL, connected in series with one another, are connected in parallel with the switch S1. Finally, a capacitor C5 for starting up the lamp FL is connected in parallel with the lamp FL.

The drivers Dr1 and Dr2 alternately open and close the switches S1 and S2, respectively, in a manner such that when one switch is open the other switch is closed and vice versa. When the switch S2 is open, a voltage step, in the embodiment in question of 300V, is applied to the terminals of the charge pump C1, D1, C2 (since the switch S1 is closed). A current therefore flows in the charge pump C1, D1, C2 and charges the capacitors C1, C2 and C3. When the switch S2 is closed, the diode D1 is reverse biased so as to prevent the capacitor C1 from discharging. A suitable voltage (for example 10V) is thus produced at the terminals of the capacitor C1 and is used for supplying the driver Dr2. Typically, a stabilizing Zener diode (not shown in the drawing) is provided inside the driver Dr2, connected in parallel with the capacitor C1, for limiting the maximum voltage at the terminals thereof.

The supply voltage supplied by the capacitor C1 is suitably translated, for example, to a value of 290V. This translated voltage is applied, by means of the translation terminal of the driver Dr2, to the negative supply terminal (−) of the driver Dr1. The positive supply terminal (+) is supplied with the voltage of 300V. The driver Dr1 is thus also supplied with a suitable voltage, such as in the illustrated embodiment of 300−290=10 V.

A square wave is produced at the terminals of the switch S2, with a voltage value of 0 when the switch S2 is closed (and the switch S1 is open) and a voltage value of 300V when the switch S2 is open (and the switch S1 is closed). This square wave is filtered by the inductor L1 and by the capacitor C4 so that, at the terminals of the lamp FL, there is a sinusoidal voltage of predetermined high frequency, for example of 50 kHz.

Figure 3:
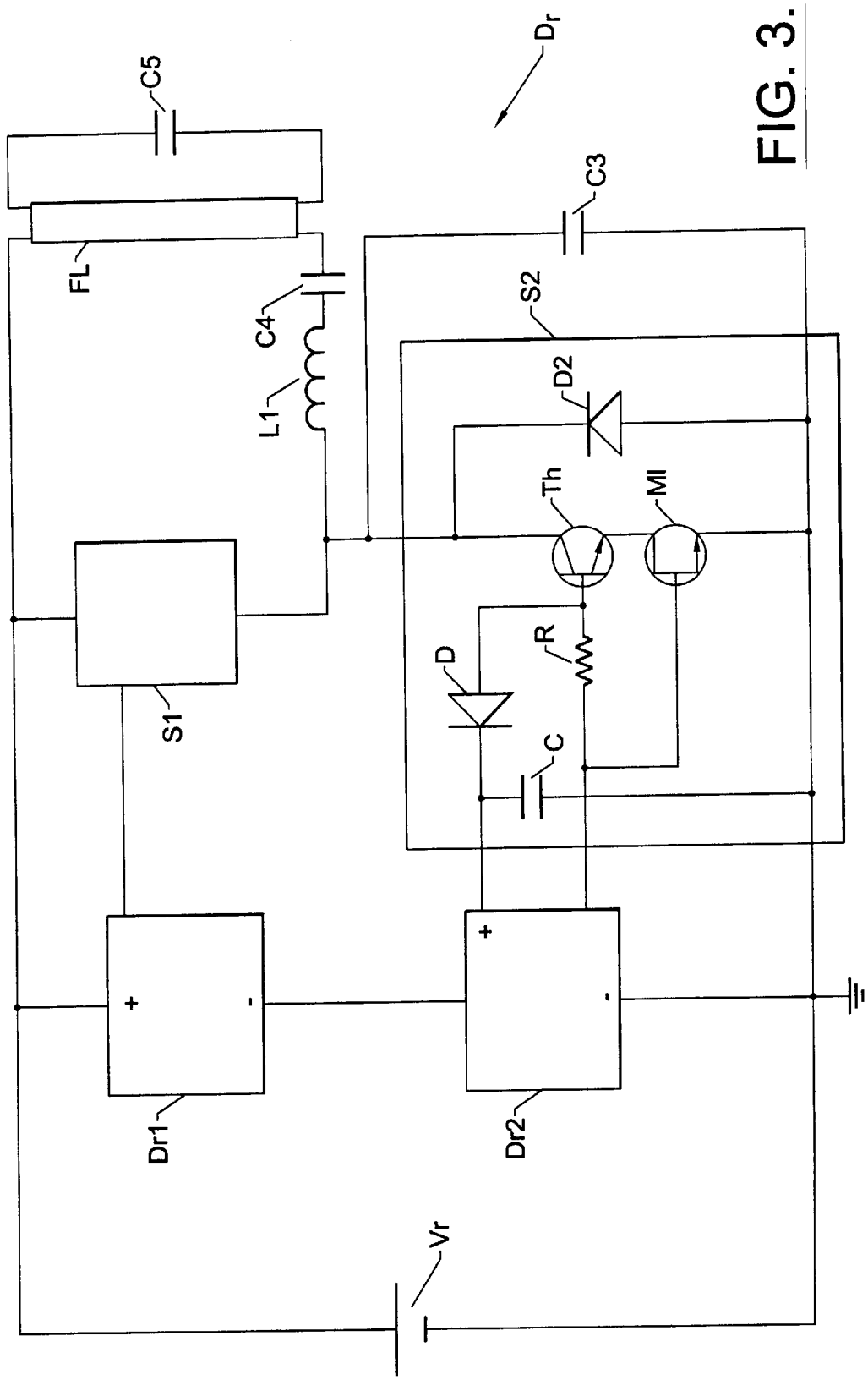
FIG. 3 shows an example of the use of the device of the present invention in the circuit of FIG. 2.

With reference now to FIG. 3 (the elements already shown in FIGS. 1a and 2 are identified by the same reference symbols), a basic diagram of a lamp driver circuit Dr is illustrated comprising the device in an emitter-switching configuration of the present invention. In particular, the device of the present invention is used to form the switch S2. Similar remarks apply if the device is used to form the switch S1 or both of the switches S1 and S2.

The switch S2 comprises the device in emitter-switching configuration of FIG. 1a, in which the source terminal of the transistor M1 is connected to the negative supply terminal (−) of the driver Dr2, the collector terminal of the transistor Th is connected to the power terminal (connected to the inductor L1) of the switch S1, and the control terminal of the driver Dr2 is connected to the base terminal of the transistor Th (via the resistor R) and to the gate terminal of the transistor M1. A free-wheeling diode D2 is connected to the source terminal of the transistor M1 and to the collector terminal of the transistor Th by its anode and cathode terminals, respectively. The snubber capacitor C3 in this embodiment is connected between the source terminal of the transistor M1 and the collector terminal of the transistor Th.

The terminal of the capacitor C which is connected to the source terminal of the transistor M1 is therefore connected to the negative supply terminal (−) of the driver Dr2. The other terminal of the capacitor C (connected to the cathode of the diode D) is connected to the positive supply terminal (+) of the driver Dr2. This capacitor is used to supply the driver Dr2 (in the same manner as the capacitor C1 of FIG. 2). Each time the switch S2 is turned off, the capacitor C is charged so as to replace the electrical charge supplied by the same capacitor to the driver Dr2 when the switch S2 is conducting. This structure is particularly simple and offers the advantage of a considerable saving in components (the elements D1 and C2 of FIG. 2).

The device of the present invention may, however, also be used in other applications such as, for example, a voltage regulator for a supply system, or the like. Naturally, in order to satisfy contingent and specific requirements, one of skill That which is claimed is:

1. A device in an emitter-switching configuration having a first power terminal, a second power terminal, and a control terminal, said device comprising:

a high-voltage switching element comprising a high-voltage bipolar power transistor having a collector terminal connected to the first power terminal of the device, a base terminal connected to the control terminal of the device, and an emitter terminal;

a low-voltage switching element comprising a transistor having a first, charge-collection terminal connected to the emitter terminal of the high-voltage switching element, and a second terminal and a control terminal which are connected to the second power terminal and to the control terminal of the device, respectively; and connection means for discharging an electrical charge from the base terminal of the high-voltage switching element to the second terminal of the low-voltage switching element during a turning-off of the device, said connection means comprising recovery means for recovering the electrical charge, wherein said recovery means comprises a capacitor and a diode connected in series so that when the diode is biased in a direction of conduction, current flows through the connection means from the base terminal of a high-voltage transistor towards the second terminal of the low-voltage switching element.

2. A device according to claim 1, wherein said low-voltage switching element comprises a field-effect transistor so that the first terminal, the second terminal and the control terminal of the low-voltage switching element are a drain terminal, a source terminal and a gate terminal, respectively, of the field-effect transistor.

3. A device according to claim 1, wherein said low-voltage switching element comprises a bipolar transistor so that the first terminal, the second terminal and the control terminal of the low-voltage switching element are a collector terminal, an emitter terminal and a base terminal, respectively, of the bipolar transistor.

4. A device according to claim 1, wherein the high-voltage switching element comprises at least two high-voltage bipolar transistors in a Darlington configuration, each having a collector terminal, an emitter terminal and a base terminal; and wherein the collector terminal, the emitter terminal and the base terminal of the high-voltage switching element are the collector terminal of a first high-voltage transistor, an emitter terminal of a last high-voltage transistor, and a base terminal of the first high-voltage transistor, respectively.

5. A device according to claim 4, wherein said recovery means further comprises a second diode each diode having an anode terminal connected to the base terminal of a corresponding high-voltage transistor; and wherein the capacitor has a first terminal connected to a cathode terminal of the diodes and a second terminal connected to the second terminal of the low-voltage switching element.

6. A device in an emitter-switching configuration having a first power terminal, a second power terminal, and a control terminal, said device comprising:

a high-voltage switching element comprising a high-voltage bipolar power transistor having a collector terminal connected to the first power terminal of the device, a base terminal connected to the control terminal of the device, and an emitter terminal;

a low-voltage switching element comprising a transistor having a first, charge-collection terminal connected to the emitter terminal of the high-voltage switching element, and a second terminal and a control terminal which are connected to the second power terminal and to the control terminal of the device, respectively; and connection means for discharging an electrical charge from the base terminal of the high-voltage switching element to the second terminal of the low-voltage switching element during a turning-off of the device, said connection means comprising a capacitor for storing the electrical charge during the turning-off to thereby facilitate recovering the electrical charge, said connection means further comprising a diode connected in series with the capacitor so that when the diode is biased in a direction of conduction, current flows through the connection means from the base terminal of a high-voltage transistor toward the second terminal of the low-voltage switching element.

7. A device according to claim 6, wherein said low-voltage switching element comprises a field-effect transistor so that the first terminal, the second terminal and the control terminal of the low-voltage switching element are a drain terminal, a source terminal and a gate terminal, respectively, of the field-effect transistor.

8. A device according to claim 6, wherein said low-voltage switching element comprises a bipolar transistor so that the first terminal, the second terminal and the control terminal of the low-voltage switching element are a collector terminal, an emitter terminal and a base terminal, respectively, of the bipolar transistor.

9. A device according to claim 6, wherein the high-voltage switching element comprises at least two high-voltage bipolar transistors in a Darlington configuration, each having a collector terminal, an emitter terminal and a base terminal; and wherein the collector terminal, the emitter terminal and the base terminal of the high-voltage switching element are the collector terminal of a first high-voltage transistor, an emitter terminal of a last high-voltage transistor, and a base terminal of the first high-voltage transistor, respectively.

10. A device according to claim 9, wherein said connection means further comprises a second diode each diode having an anode terminal connected to the base terminal of the corresponding high-voltage transistor from which the current flows from the base terminal to the connection means; and wherein the capacitor has a first terminal connected to the cathode terminal of the diodes and a second terminal connected to the second terminal of the low-voltage switching element.

11. A circuit comprising:

a device in an emitter-switching configuration having a first power terminal, a second power terminal, and a control terminal, said device comprising a high-voltage switching element comprising a high-voltage bipolar power transistor having a collector terminal connected to the first power terminal of the device, a base terminal connected to the control terminal of the device, and an emitter terminal, a low-voltage switching element having a first terminal connected to the emitter terminal of the high-voltage switching element, and a second terminal and a control terminal which are connected to the second power terminal and to the control terminal of the device, respectively, and connection means for discharging an electrical charge from the base terminal of the high-voltage switching element to the second terminal of the low-voltage switching element during a turning-off of the device, said connection means comprising charge storage means for storing the electrical charge during the turning-off and having first and second terminals, wherein said charge storage means comprises a capacitor and a diode connected in series so that when the diode is biased in a direction of conduction, current flows through the connection means from the base terminal of a high-voltage transistor towards the second terminal of the low-voltage switching element; and a driver element for controlling the device and having a first supply terminal and a second supply terminal connected to a first terminal and a second terminal of the capacitor, respectively.

12. A circuit according to claim 11, wherein said low-voltage switching element comprises a field-effect transistor so that the first terminal, the second terminal and the control terminal of the low-voltage switching element are a drain terminal, a source terminal and a gate terminal, respectively, of the field-effect transistor.

13. A circuit according to claim 11, wherein said low-voltage switching element comprises a bipolar transistor so that the first terminal, the second terminal and the control terminal of the low-voltage switching element are a collector terminal, an emitter terminal and a base terminal, respectively, of the bipolar transistor.

14. A circuit according to claim 11, wherein the high-voltage switching element comprises at least two high-voltage bipolar transistors in a Darlington configuration, each having a collector terminal, an emitter terminal and a base terminal; and wherein the collector terminal, the emitter terminal and the base terminal of the high-voltage switching element are the collector terminal of a first high-voltage transistor, an emitter terminal of a last high-voltage transistor, and a base terminal of the first high-voltage transistor, respectively.

15. A circuit according to claim 14, wherein said connection means further comprises a second diode each diode having an anode terminal connected to the base terminal of a corresponding high-voltage transistor; and wherein the first terminal of the capacitor connected to a cathode terminal of the diodes and the second terminal of the capacitor connected to the second terminal of the low-voltage switching element.

16. A circuit according to claim 11, further comprising:

a lamp;

a constant-voltage generator having a first terminal and a second terminal, the second terminal of the constant-voltage generator being connected to the second power terminal of the device in the emitter-switching configuration, a further high-voltage switching element having a first power terminal connected to the first terminal of the constant-voltage generator and a second power terminal connected to the first power terminal of the device in the emitter-switching configuration;

a further driver element for controlling the further high-voltage switching element and having a first supply terminal and a second supply terminal connected to the first terminal of the constant-voltage generator and to a translation terminal of the driver element used for controlling the device, respectively; and filtering means connected to the further high-voltage switching element to apply a substantially sinusoidal voltage of predetermined frequency to said lamp.

* * * * *